United States Patent
Takumi et al.

(10) Patent No.: US 11,326,279 B2
(45) Date of Patent: May 10, 2022

(54) ANTIBACTERIAL YARN AND ANTIBACTERIAL FABRIC

(71) Applicant: Murata Manufacturing Co., Ltd., Nagaokakyo (JP)

(72) Inventors: Kenichiro Takumi, Nagaokakyo (JP); Takafumi Inoue, Nagaokakyo (JP); Daiji Tamakura, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 268 days.

(21) Appl. No.: 16/504,753

(22) Filed: Jul. 8, 2019

(65) Prior Publication Data

US 2019/0330771 A1    Oct. 31, 2019

Related U.S. Application Data

(63) Continuation of application No. PCT/JP2018/038275, filed on Oct. 15, 2018.

(30) Foreign Application Priority Data

Oct. 17, 2017   (JP) .............................. JP2017-201235

(51) Int. Cl.
| | | |
|---|---|---|
| *D02G 3/44* | (2006.01) | |
| *D02G 3/38* | (2006.01) | |
| *D02G 3/04* | (2006.01) | |
| *D03D 15/00* | (2021.01) | |
| *H01L 41/113* | (2006.01) | |
| *H01L 41/08* | (2006.01) | |
| *H01L 41/193* | (2006.01) | |
| *H01L 37/02* | (2006.01) | |
| *D03D 15/47* | (2021.01) | |

(52) U.S. Cl.
CPC ............... *D02G 3/449* (2013.01); *D02G 3/04* (2013.01); *D02G 3/38* (2013.01); *D03D 15/47* (2021.01); *H01L 37/025* (2013.01); *H01L 41/082* (2013.01); *H01L 41/113* (2013.01); *H01L 41/193* (2013.01); *D10B 2401/13* (2013.01); *D10B 2401/16* (2013.01)

(58) Field of Classification Search
None
See application file for complete search history.

(56) References Cited

U.S. PATENT DOCUMENTS

2010/0221471 A1*  9/2010  Green ................. D01F 6/625
                                                    428/35.7

FOREIGN PATENT DOCUMENTS

| CN | 202430389 U | 9/2012 |
|---|---|---|
| JP | 2000144545 A | 5/2000 |
| JP | 2000303283 A | 10/2000 |

(Continued)

OTHER PUBLICATIONS

Machine translation of JP2010057606, Nishiyama (Year: 2010).*

(Continued)

*Primary Examiner* — Shawn Mckinnon
(74) *Attorney, Agent, or Firm* — ArentFox Schiff LLP

(57) ABSTRACT

An antibacterial yarn that includes a core yarn including a functional polymer that generates a charge by external energy and a first sheath yarn higher in hygroscopicity than the core yarn, the first sheath yarn covering at least a part of a periphery of the core yarn across an axial direction of the core yarn.

10 Claims, 10 Drawing Sheets

(56) References Cited

FOREIGN PATENT DOCUMENTS

| JP | 2002249938 A | | 9/2002 |
|---|---|---|---|
| JP | 2006320491 A | | 11/2006 |
| JP | 2010057606 | * | 3/2010 |
| JP | 2011058120 A | | 3/2011 |
| JP | 2014083070 A | | 5/2014 |

OTHER PUBLICATIONS

Machine translation of JP2000144545 (Year: 2000).*
International Search Report issued for PCT/JP2018/038275, dated Nov. 20, 2018.
Takaki, Koichi; "Agricultural and Food Processing Applications of High-Voltage and Plasma Technologies"; J. Htsj, vol. 51, No. 216, Jul. 2012, pp. 64-69. (Translation of Section 5 p. 67 "Freshness retention and component extraction by high voltage").
Microorganism Control—Science and Engineering published by Kodansha Ltd, Copyright T. Tsuchido, H. Kourai, H. Matsuoka, J. Koizumi, 2002; "Electrical Control" Section 4.1.3, p. 50. (Translation of section 4.1.3, p. 50).
Fukada, E.; "Piezoelectricity of Biopolymers", Polymer vol. 16 (1967), No. 9, pp. 795-800. (Translation of abstract only).
Written Opinion of the International Searching Authority issued for PCT/JP2018/038275, dated Nov. 20, 2018.
Chinese Office Action issued for CN Application No. 201880005195.5, dated Jul. 5, 2021.
Chinese Office Action issued for CN Application No. 201880005195.5, dated Dec. 14, 2021.

* cited by examiner

ANTIBACTERIAL YARN AND ANTIBACTERIAL FABRIC

CROSS REFERENCE TO RELATED APPLICATIONS

The present application is a continuation of International application No. PCT/JP2018/038275, filed Oct. 15, 2018, which claims priority to Japanese Patent Application No. 2017-201235, filed Oct. 17, 2017, the entire contents of each of which are incorporated herein by reference.

FIELD OF THE INVENTION

The present invention relates to an antibacterial yarn having antibacterial properties and an antibacterial fabric including the same.

BACKGROUND OF THE INVENTION

Conventionally, many proposals have been made for antibacterial yarns or antibacterial fabrics having antibacterial properties (see Patent Document 1). The mask filter described in Patent Document 1 has been produced by applying a drug having tackiness to a mesh fabric provided with a network having openings extending in the thickness direction, thereby imparting adhesive force to the mesh fabric, and then attaching activated carbon particles to the mesh fabric to which the adhesive force has been imparted.

Patent Document 1: Japanese Patent Application Laid-Open No. 2006-320491

SUMMARY OF THE INVENTION

In the mask filter described in Patent Document 1, the mesh fabric is a gauze fabric made of a material such as a natural fiber, a chemical fiber, or a synthetic fiber.

When using such a gauze fabric, it is possible to collect or remove relatively large particles, but it is difficult to collect or remove fine particles, such as bacteria, viruses and pollen, in the air. Even when layers of gauze fabric are laminated, performance of collecting or removing fine particles is not improved so much, but rather air permeability deteriorates and comfort may be impaired.

In addition, when a fine synthetic fiber nonwoven fabric or the like is used in place of the gauze fabric, the performance of collecting or removing fine particles is improved, but the air permeability is lowered. Therefore, when a mask is worn, a damp feeling due to moisture is enhanced and comfort during use may deteriorate.

Thus, it is an aim of the present invention to provide an antibacterial yarn and an antibacterial fabric that is highly comfortable to wear and superior in performance of collecting or removing fine particles.

The antibacterial yarn according to one embodiment of the present invention includes a core yarn including a functional polymer that generates a charge by external energy and a first sheath yarn higher in hygroscopicity than the core yarn, the first sheath yarn covering at least a part of the periphery of the core yarn across the axial direction of the core yarn.

Conventionally, it has been known that the proliferation of bacteria and fungi can be inhibited by an electric field (see, for example, Tetsuaki Doito, Hiroshi Koryo, Hideaki Matsuoka, Junichi Koizumi, Kodansha: Microbial Control-Science and Engineering; see for example, Koichi Takagi, Application of High Voltage Plasma Technology to Agriculture Food Field, and see J. HTSJ, Vol. 51, No. 216).

A potential which produces the electric field may cause an electric current to flow in a current path formed due to humidity or the like, or in a circuit formed through a local phenomenon of microdischarge. This electric current is considered to weaken bacteria and inhibit the proliferation of bacteria.

The antibacterial yarn according to one embodiment of the present invention generates an electric field when the antibacterial yarn is brought between fibers or close to an object with a prescribed electric potential (including a ground potential), such as a human body. Alternatively, the antibacterial yarn according to one embodiment of the present invention allows an electric current to flow when the antibacterial yarn is brought between fibers or close to an object with a prescribed electric potential (including a ground potential), such as a human body, with moisture such as sweat interposed therebetween.

Therefore, the antibacterial yarn according to one embodiment of the present invention exerts an antibacterial effect for the following reasons. The direct action of an electric field or an electric current that is generated when the antibacterial fiber is applied to an object (a clothing article, footwear, or a medical supply such as a mask) for use close to an object with a prescribed potential, such as a human body, poses a problem for cell membranes of bacteria or an electron transfer system for maintaining the lives of bacteria, thereby killing the bacteria, or weakening the bacteria themselves. Furthermore, oxygen included in moisture may be changed to active oxygen species by an electric field or an electric current, or oxygen radicals may be generated in cells of bacterium due to the stress environment in the presence of an electric field or an electric current, and the action of the active oxygen species including radicals kills or weakens bacteria. In addition, the above-mentioned reasons may be combined to produce an antibacterial effect in some cases. It is noted that the term "antibacterial" in the present disclosure refers to a concept that includes both an effect of suppressing the generation of bacteria and an effect of killing bacteria.

The core yarn including a functional polymer that generates a charge by external energy is considered to include, for example, a material that has a photoelectric effect, a material that has a pyroelectric effect, or a fiber that uses a piezoelectric body or the like. Further, a configuration in which a conductor is included in a core yarn, around which an insulator is then wound, and then a voltage is applied to the conductor to generate charges can also be used as a core yarn.

When a piezoelectric body is used, an electric field is generated by piezoelectricity, and thus, no power supply is required, and there is no risk of electric shock. In addition, the lifetime of the piezoelectric body lasts longer than the antibacterial effect of a drug or the like. In addition, the piezoelectric body is less likely to cause an allergic reaction than drugs.

The antibacterial yarn according to one embodiment of the present invention has a structure in which a first sheath yarn higher in hygroscopicity than the core yarn covers at least a part of the periphery of the core yarn. Moisture near the antibacterial yarn is absorbed by the first sheath yarn. Fine particles such as pollen and bacteria are prone to be attracted and held by the moisture absorbed by the first sheath yarn. Thus, the antibacterial yarn according to one embodiment of the present invention is superior in the performance of collecting fine particles and can efficiently exert an antibacterial effect against bacteria and the like attracted by charges generated by the core yarn.

Moreover, the antibacterial yarn according to one embodiment of the present invention can have an improved texture since the antibacterial yarn has a structure in which a first sheath yarn higher in hygroscopicity than the core yarn covers at least a part of the periphery of the core yarn.

The antibacterial fabric according to one embodiment of the present invention is characterized by including any one of the above-mentioned antibacterial yarns.

With this configuration, it is possible to obtain an antibacterial fabric that is superior in the performance of collecting fine particles, and can exert an antibacterial effect against bacteria and the like attracted on the antibacterial fabric, and has good texture.

According to the present invention, it is possible to realize an antibacterial yarn and an antibacterial fabric that is highly comfortable to wear and superior in performance of collecting or removing fine particles.

DETAILED DESCRIPTION OF THE INVENTION

Figure 1A:
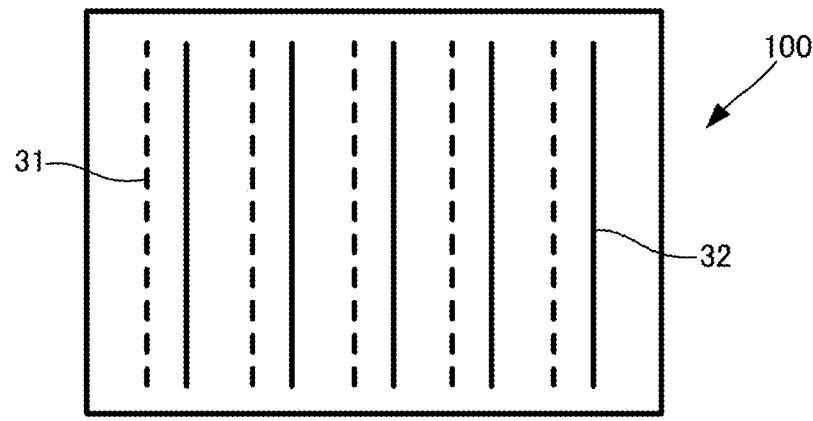
FIG. 1(A) is a schematic view showing the antibacterial fabric according to the first embodiment.
Figure 1B:
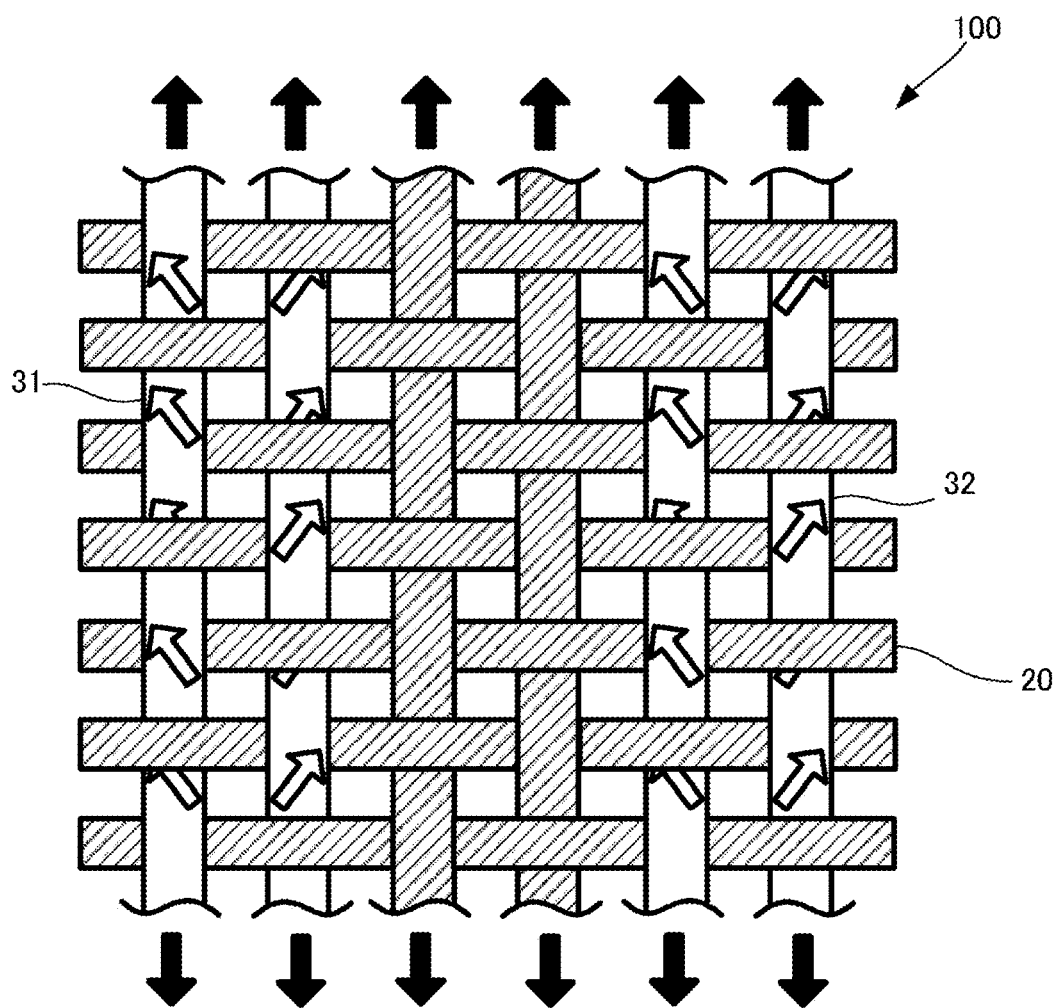
FIG. 1(B) is a partially enlarged view of FIG. 1(A).

FIG. 1(A) is a schematic view showing the antibacterial fabric according to the first embodiment, and FIG. 1(B) is a partially enlarged view of FIG. 1(A).

As shown in FIG. 1(A) and FIG. 1(B), the antibacterial fabric 100 includes a plurality of first antibacterial yarns 31, second antibacterial yarns 32, and non-piezoelectric yarns 20. The non-piezoelectric yarns 20 include those commonly used as yarns which are made of natural fibers such as cotton or wool or synthetic fibers and generate no charges. In addition, the non-piezoelectric yarns 20 may include one that generates weaker charge as compared with the first antibacterial yarns 31 and the second antibacterial yarns 32. In the antibacterial fabric 100, the first antibacterial yarns 31 and the second antibacterial yarns 32 are woven together with the non-piezoelectric yarns 20 with the first antibacterial yarns and the second antibacterial yarns arranged alternately in parallel.

In detail, in the antibacterial fabric 100, the warps are first antibacterial yarns 31, second antibacterial yarns 32, and non-piezoelectric yarns 20, whereas the wefts are non-piezoelectric yarns 20. It is noted that the warps are not always necessary to include the non-piezoelectric yarns 20 and may include only the first antibacterial yarns 31 and the second antibacterial yarns 32. Further, the wefts are not limited to the non-piezoelectric yarns 20 and may include first antibacterial yarns 31 or second antibacterial yarns 32. For example, the warps may be non-piezoelectric yarns 20 and the wefts may be first antibacterial yarns 31 or second antibacterial yarns 32. Furthermore, both the warps and the wefts may include first antibacterial yarns 31 or second antibacterial yarns 32.

Figure 2A:
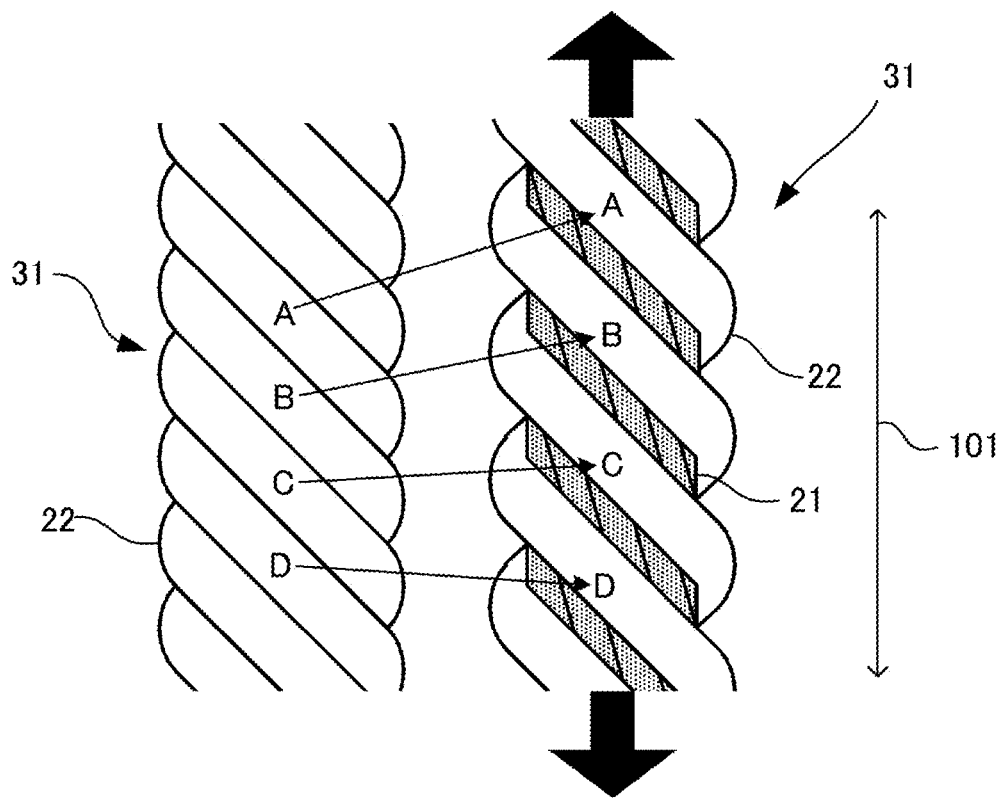
FIG. 2(A) is a partially enlarged view for explaining the configuration of the antibacterial yarn in the antibacterial fabric according to the first embodiment.
Figure 2B:
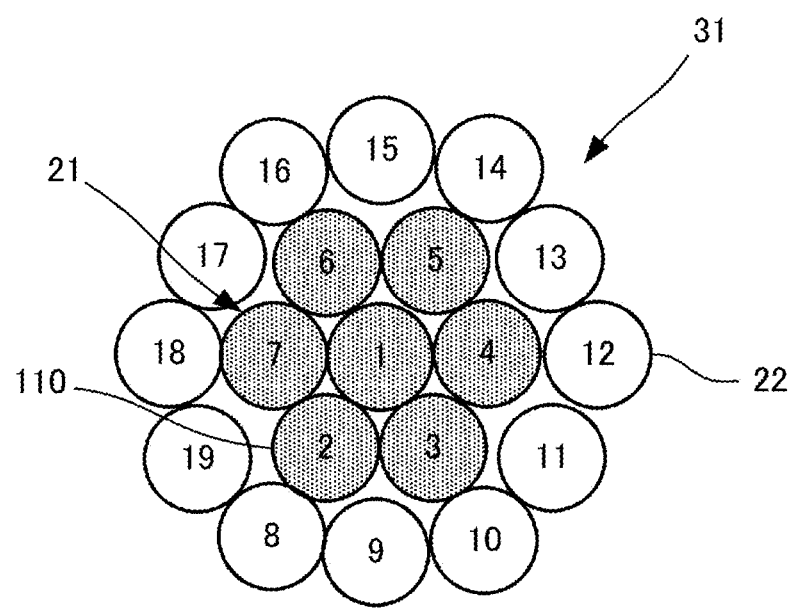
FIG. 2(B) is a cross-sectional view of FIG. 2(A).

FIG. 2(A) is a partially enlarged view for explaining the configuration of the antibacterial yarn in the antibacterial fabric according to the first embodiment, and FIG. 2(B) is a cross-sectional view produced by cutting FIG. 2(A) along a plane perpendicular to the axial direction of the antibacterial yarn. The left view of FIG. 2(A) shows an antibacterial yarn in a normal state, the right view of FIG. 2(A) shows the antibacterial yarn with the sheath yarns surrounding the core yarns separated at intervals in the direction indicated by the arrows in the view so that the core yarns can be seen for the sake of explanation. The first antibacterial yarn 31 will be explained first, and the second antibacterial yarn 32 will be explained later on only differences from the former.

As shown in FIGS. 2(A) and 2(B), the first antibacterial yarn 31 includes a core yarn 21 and first sheath yarns 22. The first sheath yarns 22 cover the periphery of the core yarn 21. For example, the first sheath yarns 22 are composed of twelve yarns numbered 8 to 19 shown in FIG. 2(B). The number of the first sheath yarns 22 is not limited to this and is practically set appropriately in view of the application, etc.

The first antibacterial yarn 31 is a yarn having a layered structure including an inner layer made of the core yarn 21 and an outer layer of the first sheath yarns 22. The first sheath yarns 22 are merely required to cover at least a part of the core yarn 21 as shown in the right view of FIG. 2(A) and are not required to cover the entire periphery of the core yarns 21. It is also possible to cover the core yarn 21 with a porous material such as a nonwoven fabric instead of the first sheath yarns 22. As a result, the hygroscopicity can be further improved.

The core yarn 21 includes piezoelectric yarns 110 having a functional polymer that generates a charge by external energy. The core yarn 21 is a right-twisted yarn (hereinafter referred to as S yarn) in which the piezoelectric yarns 110 are twisted to the right. That is, the core yarn 21 is a twisted yarn (multifilament yarn) formed by twisting the piezoelectric yarns 110. The core yarn 21 corresponds to the "first piezoelectric fiber" in the present disclosure.

In the first antibacterial yarn 31, the axial direction 101 of the core yarn 21 is inclined to the left with respect to the axial direction 101 of the first antibacterial yarn 31. FIG. 2(A) and FIG. 2(B) show a core yarn 21 formed by twisting seven piezoelectric yarns 110 (1 to 7) as one example, but the number of piezoelectric yarns 110 is not limited to this and it is in practice set appropriately in view of the application and the like.

The first sheath yarn 22 is made of a material higher in hygroscopicity than the core yarn 21. Examples of the material of the first sheath yarn 22 include natural fibers such as cotton, hemp, wool, and silk, regenerated fibers such as rayon and cupro, and semi-synthetic fibers such as acetate. In addition, the piezoelectric yarns 110 constituting the core yarn 21 are generally harder and inferior in texture as compared with the above-mentioned commonly used yarns. In the first antibacterial yarn 31, the first sheath yarns higher in hygroscopicity than the core yarn cover at least a part of the periphery of the core yarn. Therefore, it is possible to improve the texture of the first antibacterial yarn 31.

Since the first sheath yarns 22 higher in hygroscopicity than the core yarn 21 cover at least a part of the periphery of the core yarn, the first sheath yarns 22 are arranged on the side where the first antibacterial yarn 31 comes into contact with the outside thereof. The moisture being in contact with the first antibacterial yarn 31 or the moisture existing near the first antibacterial yarn 31 is attracted by the first sheath yarns 22. With this structure, the first sheath yarns 22 of the first antibacterial yarn 31 are prone to hold moisture between fibers.

When there is moisture, fine particles such as pollen and bacteria are prone to be attracted to the moisture. Therefore, fine particles such as pollen and bacteria are prone to be attracted to the moisture absorbed by the first sheath yarns 22. In addition, fine particles such as pollen and bacteria are more likely to be held by the first sheath yarns 22. As a result, the first antibacterial yarn 31 is superior in performance of collecting fine particles. In addition, as will be described later, it is possible to efficiently exert an antibacterial effect against bacteria and the like attracted by charges generated by the core yarn 21.

The piezoelectric yarn 110 is an example of a charge generation fiber (charge generation yarn) that generates a charge by external energy. The piezoelectric yarn 110 is made of a functional polymer, for example, a piezoelectric polymer. Examples of the piezoelectric polymer include polylactic acid (PLA). It is noted that polylactic acid (PLA) is a piezoelectric polymer having no pyroelectricity. Polylactic acid is uniaxially stretched to have piezoelectric properties. Polylactic acid includes PLLA, in which an L-form monomer is polymerized, and PDLA, in which a D-form monomer is polymerized. It is noted that the piezoelectric yarns 110 may further contain a material other than the functional polymer as long as it does not inhibit the function of the functional polymer.

Polylactic acid is a chiral polymer and its main chain has a helical structure. Polylactic acid exhibits piezoelectricity when it is uniaxially stretched and molecules thereof are thereby oriented. When the degree of crystallization is further increased by further applying heat treatment, the piezoelectric constant increases. A piezoelectric yarn 110 made of uniaxially stretched polylactic acid has tensor components of $d_{14}$ and $d_{25}$ as piezoelectric strain constants, when the thickness direction is defined as a first axis, the stretching direction is defined as a third axis, and the direction orthogonal to both the first axis and the third axis is defined as a second axis. Accordingly, polylactic acid generates charges most efficiently when a strain occurs in a direction at an angle of 45 degrees to the uniaxially stretching direction.

Figure 3A:
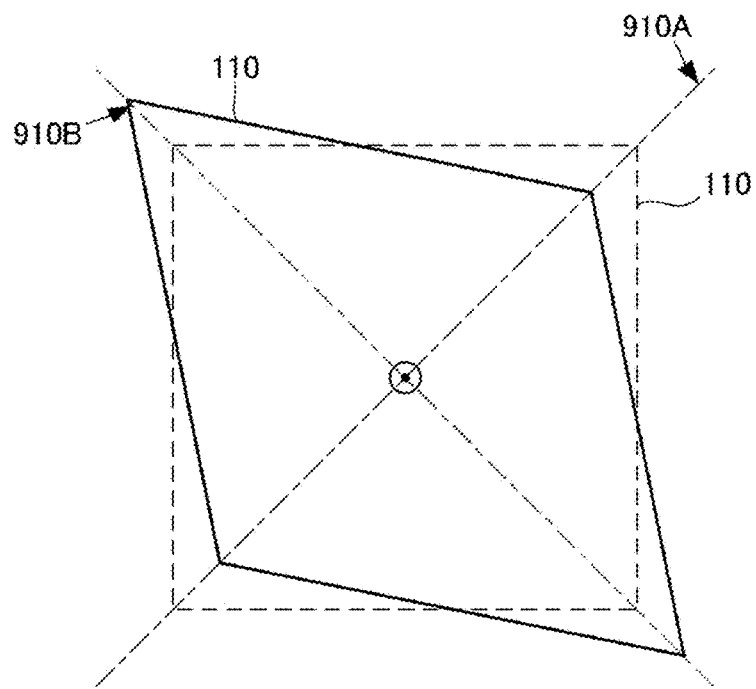
FIG. 3(A) and FIG. 3(B) are views showing a relationship of a uniaxially stretching direction of polylactic acid, an electric field direction, and deformation of a piezoelectric fiber.
Figure 3B:
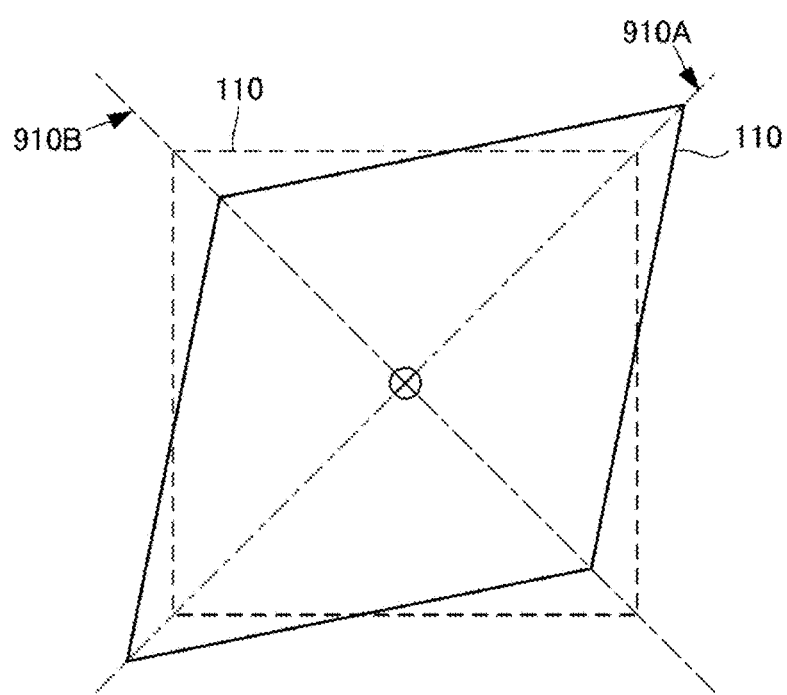

FIG. 3(A) and FIG. 3(B) are views showing a relationship of a uniaxially stretching direction of polylactic acid, an electric field direction, and deformation of a piezoelectric fiber. As shown in FIG. 3(A), when the piezoelectric yarn 110 shrinks in a direction of a first diagonal line 910A and stretches in a direction of a second diagonal line 910B orthogonal to the first diagonal line 910A, an electric field is produced in a direction from the back plane to the front plane of the paper. That is, the piezoelectric yarn 110 generates negative charges on the front plane of the paper. As shown in FIG. 3(B), even when the piezoelectric yarn 110 stretches in the first diagonal line 910A and shrinks in the second diagonal line 910B, charges are generated, but the polarity is reversed, and an electric field is produced in a direction from the front plane to the back plane of the paper. That is, the piezoelectric yarn 110 generates positive charges on the front plane of the paper.

Since polylactic acid generates piezoelectric properties due to molecular orientation processing by stretching, it does not need to be subjected to polling processing as do other piezoelectric polymers such as (polyvinylidene fluoride) PVDF or piezoelectric ceramic. Uniaxially stretched polylactic acid has a piezoelectric constant of approximately 5 to 30 pC/N, which is an extremely high piezoelectric constant among polymers. Furthermore, the piezoelectric constant of polylactic acid does not vary with time and is extremely stable.

The piezoelectric yarn 110 is a fiber that is circular in cross section. The piezoelectric yarn 110 can be produced by, for example, the methods such as a method of extruding and shaping, for example, a piezoelectric polymer to be made into a fibrous form; a method of melt-spinning a piezoelectric polymer to be made into a fibrous form (for example, a spinning and drawing method in which a spinning step and a drawing step are performed separately from each other, a direct drawing method in which a spinning step and a drawing step are linked to each other, a POY-DTY method in which a false twisting step can also be attained at the same time, or a super high speed prevention method in which the spinning speed is made high); a method of dry- or wet-spinning a piezoelectric polymer to be made into a fibrous form (for example, a phase-separating method or dry- or wet-spinning method of dissolving a polymer, which is a raw material, into a solvent, and extruding out the solution through a nozzle to be made into a fibrous form, a gel spinning method of making a polymer into a gel form in the state the polymer contains a solvent, so as to be evenly made into a fibrous form, or a liquid crystal spinning method of using a solution of a liquid crystal or a melted body thereof to make the liquid crystal into a fibrous form); or a method of spinning a piezoelectric polymer electrostatically to be made into a fibrous form. It is noted that the cross-sectional shape of the piezoelectric yarn 110 is not limited to any circular shape.

Figure 4A:
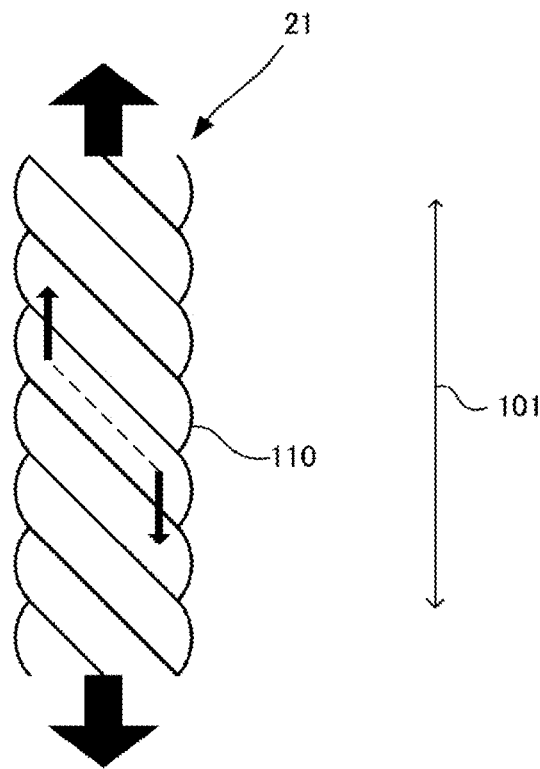
FIG. 4(A) is a view showing the shear force (shear stress) generated in each piezoelectric fiber when a tension is applied to the first piezoelectric fiber and FIG. 4(B) shows the shear force (shear stress) generated in each piezoelectric fiber when a tension is applied to the second piezoelectric fiber.
Figure 4B:
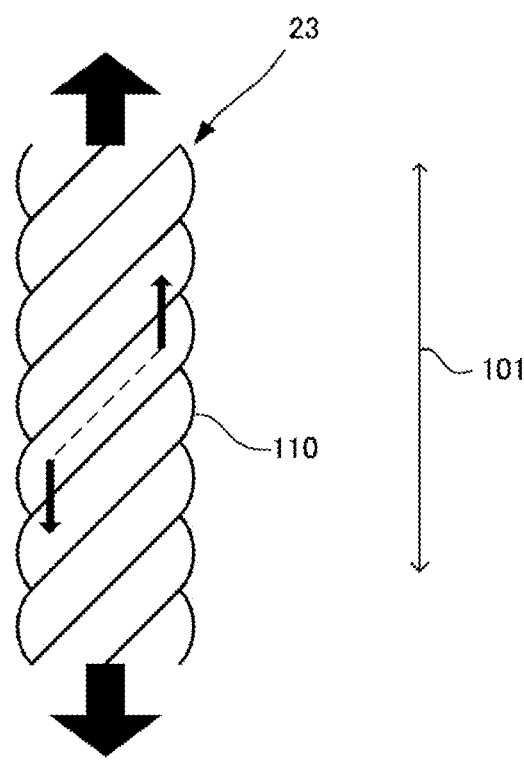

FIG. 4(A) is a view showing the shear force (shear stress) generated in each piezoelectric fiber when a tension is applied to the first piezoelectric fiber and FIG. 4(B) shows the shear force (shear stress) generated in each piezoelectric fiber when a tension is applied to the second piezoelectric fiber.

As shown in FIG. 4(A), when a tension is applied to the first antibacterial yarn 31, a force in the axial direction 101 of the first antibacterial yarn 31 is added to the core yarn 21 existing inside the first antibacterial yarn 31. At this time, a force in the axial direction 101 of the first antibacterial yarn 31 is added to the piezoelectric yarns 110 constituting the core yarn 21.

When a tension has been applied to the piezoelectric yarns 110 of the core yarn 21 that is an S yarn, the surface of the piezoelectric yarns 110 is in a state shown in FIG. 3(A). Therefore, a negative charge is generated on the surface of the core yarn 21, and a positive charge is generated inside the core yarn 21.

The core yarn 21 produces an electric field due to the potential difference generated by these charges. The electric field leaks to even adjacent spaces to form an electric field associated with other portions. When the potential produced in the core yarn 21 comes close to an object being close to the first antibacterial yarn 31 and having a prescribed potential, for example, a prescribed potential (including a ground potential) of a human body or the like, an electric field is produced between the first antibacterial yarn 31 and the object.

As shown in FIG. 4(B), the second antibacterial yarn 32 includes a core yarn 23. The core yarn 23 is a left-twisted yarn in which piezoelectric yarns 110 are twisted to the left. The core yarn 23 corresponds to the "second piezoelectric fiber" in the present disclosure. When a tension is added to the second antibacterial yarn 32, a tension is applied to the piezoelectric yarns 110 of the core yarn 23 that is a Z yarn. At this time, the surface of the piezoelectric yarns 110 is in a state shown in FIG. 3(B). Therefore, a positive charge is generated on the surface of the core yarn 23, whereas a negative charge is generated inside the core yarn 23.

Conventionally, it has been known that the proliferation of bacteria and fungi can be inhibited by an electric field (see, for example, Tetsuaki Doito, Hiroshi Koryo, Hideaki Matsuoka, Junichi Koizumi, Kodansha: Microbial Control-Science and Engineering; see for example, Koichi Takagi, Application of High Voltage Plasma Technology to Agriculture Food Field, and see J. HTSJ, Vol. 51, No. 216). A potential which produces the electric field may cause an electric current to flow in a current path formed due to humidity or the like, or in a circuit formed through a local phenomenon of microdischarge. This electric current is considered to weaken bacteria and inhibit the proliferation of bacteria. The bacteria as used in the present embodiment include germs, fungi, or microorganism such as mites and fleas.

Therefore, the first antibacterial yarn 31 directly exerts an antibacterial effect with an electric field that is formed in the vicinity of the first antibacterial yarn 31, or with an electric field that is generated when the first antibacterial yarn is brought close to an object with a prescribed electric potential, such as a human body. Alternatively, the first antibacterial yarn 31 allows an electric current to flow when the first antibacterial yarn comes close to another adjacent fiber or an object having a prescribed potential such as a human body, with moisture such as sweat interposed therebetween. The first antibacterial yarn 31 may also directly exert an antibacterial effect due to such an electric current. Alternatively, the first antibacterial yarn may indirectly exert an antibacterial effect due to active oxygen species which oxygen contained in moisture is converted into by the action of electric current or voltage, radical species generated by the interaction with an additive contained in the fibers or by catalysis, or other antibacterial chemical species (amine derivatives or the like). Alternatively, oxygen radicals may be produced in cells of bacteria by a stress environment based on the presence of an electric field or an electric current, and in this way, the first antibacterial yarn 31 may indirectly exhibits an antibacterial effect. The second antibacterial yarn 32 including the core yarn 23 in which the piezoelectric yarns 110 are twisted to the left can also exert an antibacterial effect directly or indirectly like the first antibacterial yarn 31. As the radicals, superoxide anion radical (active oxygen) or hydroxy radical may be generated. It is noted that the term "antibacterial" in the present embodiment refers to a concept that includes both an effect of suppressing the generation of bacteria and an effect of killing bacteria.

The core yarn 21 or the core yarn 23 may further include a metal fiber. By coating the metal fiber with copper or silver, an antibacterial effect can be exerted by ions eluted from the metal fiber. Therefore, even when the first antibacterial yarn 31 and the second antibacterial yarn 32 are not expanded and shrunk, antibacterial properties can be exhibited.

Further, the core yarn 21 or the core yarn 23 may further include fibers including PVDF. PVDF has pyroelectricity. Therefore, charges can be generated not only due to expansion and shrinkage but also due to change in temperature. Therefore, when worn by a person, antibacterial properties can be exhibited due to addition of charge generation caused by change in temperature not only when the person moves but also when the person slightly moves.

Figure 5A:
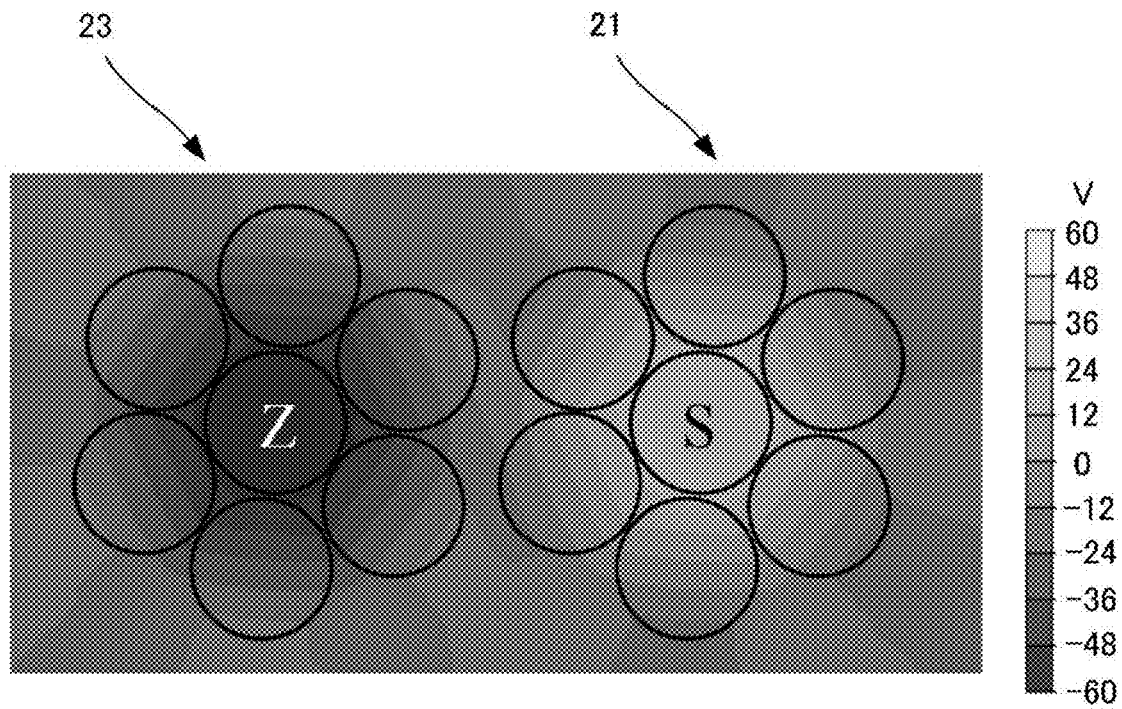
FIG. 5 (A) is a diagram showing a potential when the first piezoelectric fiber and the second piezoelectric fiber are brought close to each other.
FIG. 5(B) is a diagram showing an electric field.
Figure 5B:
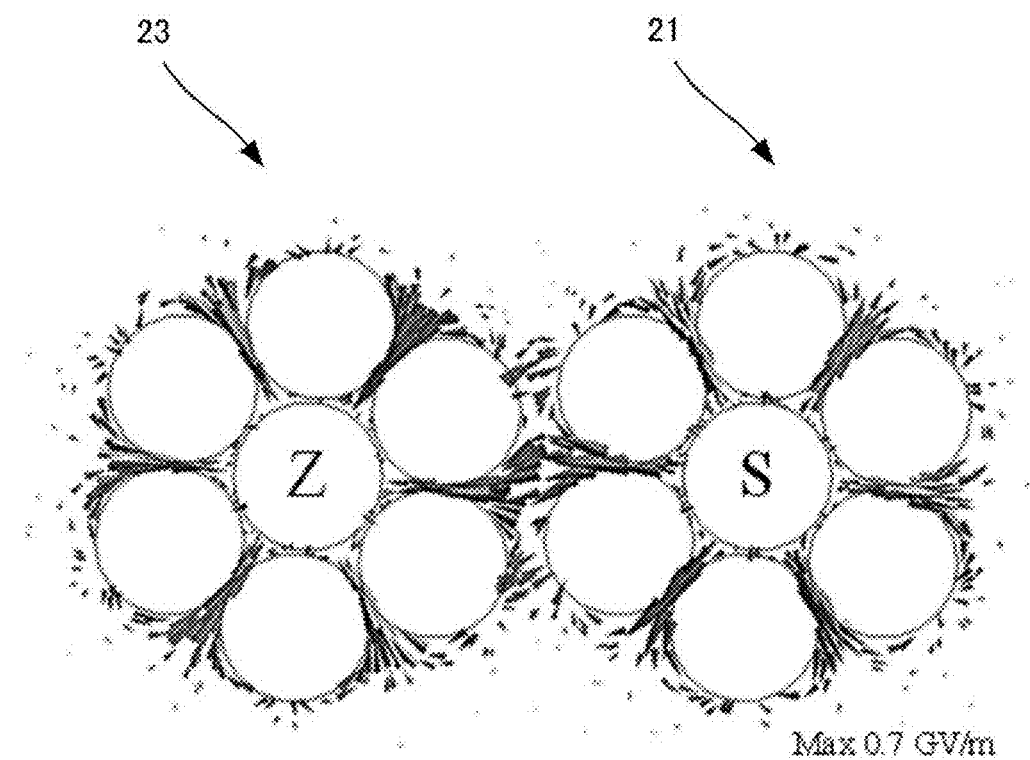

FIG. 5(A) is a diagram showing a potential when the core yarn 21, which is the first piezoelectric fiber, and the core yarn 23, which is the second piezoelectric fiber, are brought close to each other, and FIG. 5(B) is a diagram showing an electric field.

When the core yarn 21 that is an S yarn and the core yarn 23 that is a Z yarn are brought close to each other as shown in FIG. 5(A), a relatively strong electric field can be generated between the core yarn 21 and the core yarn 23. For example, the central portion of the Z yarn has a negative potential and the central portion of the S yarn has a positive potential so that adjacent portions (surfaces) have the same potential.

In this case, the nearby parts of the core yarn 21 and the core yarn 23 reach 0 V, and the positive electric potential inside the core yarn 21 is further increased so as to keep the original potential difference. Likewise, the negative electric potential inside the core yarn 23 is further decreased.

As shown in FIG. 5(B), in a cross section of the core yarn 21, an electric field directed mainly outward from the center is formed, and in a cross section of the core yarn 23, an electric field directed mainly inward from the center is formed. When the core yarn 21 and the core yarn 23 are brought close to each other, the foregoing electric fields leak into the air and then combine to form an electric field circuit between the core yarn 21 and the core yarn 23. That is, the potential difference at each point is defined by an electric field coupling circuit formed by complicatedly intertwining fibers, or a circuit formed by a current path which is accidentally formed in the yarn due to moisture or the like. Therefore, with the configuration in which the first antibacterial yarn 31 including the core yarn 21 and the second antibacterial yarn 32 including the core yarn 23 are brought close to each other, the antibacterial action can be further improved.

The above-described first antibacterial yarn 31 or second antibacterial yarn 32 can be applied to various products such as clothing articles and medical members. For example, the first antibacterial yarn 31 or the second antibacterial yarn 32 can be used for underwear (especially socks), towels, insoles of shoes, boots, and the like, general sportswear, hats, beddings (including futon, mattresses, sheets, pillows, pillowcases, and the like), toothbrushes, dental floss, various types of filters (filters of water purifiers, air conditioners, air purifiers, or the like), stuffed animals, pet-related items (pet mats, pet clothes, inners for pet clothes), various types of mats (for feet, hands, toilet seat, and the like), curtains, kitchen utensils (sponges, dishcloths, or the like), seats (seats of cars, trains, or airplanes), buffer materials and exterior materials of motorcycle helmets, sofas, bandages, gauze, masks, sutures, clothes for doctors and patients, supporters, sanitary goods, sporting goods (wear and inner gloves, gauntlets for use in martial arts, or the like), or packaging materials.

Of the clothing article, in particular, the socks (or supporters) are inevitably expanded and contracted along joints by movements such as walking, and the first antibacterial yarn 31 or the second antibacterial yarn 32 thus generates charges with high frequency. In addition, although socks absorb moisture such as sweat and serve as hotbeds for proliferation of bacteria, the first antibacterial yarn 31 or the second antibacterial yarn 32 can inhibit the proliferation of bacteria, and thus has a remarkable effect for bacterium-countermeasure for deodorization.

In addition, the first antibacterial yarn 31 or the second antibacterial yarn 32 can also be used as a method for inhibiting bacteria on the body surfaces of animals excluding human beings, and may be disposed so that a cloth including a piezoelectric body is opposed to at least a part of the skin of an animal, for inhibiting the proliferation of bacteria on the body surface of the animal opposed to the cloth by the electric charge generated when an external force is applied to the piezoelectric body. This makes it possible to restrain the proliferation of the bacteria on the body surface of the animal and cure the body surface of the animal from trichophyton in a simple manner that is higher in safety than the manner of using any drugs or the like.

The first antibacterial yarn 31 or the second antibacterial yarn 32 according to the present embodiment has the following use applications other than the bacterium-countermeasure purpose.

(1) Bioactive Piezoelectric Fiber Product

Many tissues constituting a living body have piezoelectric properties. For example, collagen constituting a human body, which is a kind of protein, is included a lot in blood vessels, dermis, ligaments, tendons, bones, cartilages, etc. Collagen is a piezoelectric body, and a tissue with collagen oriented may exhibit a great deal of piezoelectric properties. Many reports have already been made on the piezoelectric properties of bones (see, for example, Eiichi Fukada, Piezoelectricity of Biopolymer, Polymer Vol. 16 (1967) No. 9 p 795-800, etc.). Therefore, when the first antibacterial yarn 31 or the second antibacterial yarn 32 including the piezoelectric yarns 110 generates an electric field, and alternates the electric field or changes the strength of the electric field, the piezoelectric body of a living body vibrates due to the inverse piezoelectric effect. The alternated electric field or the change in the electric field strength, generated by the piezoelectric yarns 110, applies a minute vibration to a part of a living body, for example, a capillary blood vessel or dermis, thereby making it possible to encourage improvement in blood flow through the part. Thus, there is a possibility that the healing of skin diseases, wounds, and the like may be promoted. Therefore, the first antibacterial yarn 31 or the second antibacterial yarn 32 functions as a bioactive piezoelectric fiber product.

(2) Piezoelectric Fiber Product for Substance Adsorption

As described above, the piezoelectric yarn 110 of the core yarn 21, which is an S yarn, generates negative charges when an external force is applied. The piezoelectric yarn 110 in the case where the core yarn 21 is a Z yarn generates positive charges when an external force is applied. Therefore, the piezoelectric yarn 110 has a property of attracting a substance having a positive charge (e.g., particles such as pollen) and attracts a substance having a negative charge (e.g., harmful substances such as yellow dust). Accordingly, it is possible for the first antibacterial yarn 31 and the second antibacterial yarn 32 including the piezoelectric yarn 110 to attract fine particles such as pollen or yellow dust when applied to a medical supply such as a mask.

The fiber that generates charges may have a configuration in which a conductor is used as a core yarn, an insulator is wound around the conductor, and an electricity is caused to flow through the conductor to generate charges. However, a piezoelectric body generates an electric field by piezoelectricity, and thus, no power supply is required and there is no risk of electric shock. In addition, the lifetime of the piezoelectric body lasts longer than the antibacterial effect of a drug or the like. In addition, the piezoelectric body is less likely to cause an allergic reaction than drugs. In addition, the development of resistant bacteria by drugs, in particular, antibiotics and the like has become a major problem in recent years, but the sterilization method according to the present invention is not considered to produce resistant bacteria because of the mechanism.

As the fiber that generates a negative charge on its surface, a Z yarn using PDLA is considered as well as an S yarn using PLLA. In addition, as the fiber that generates a positive charge on its surface, an S yarn using PDLA is considered as well as a Z yarn using PLLA.

Figure 6A:
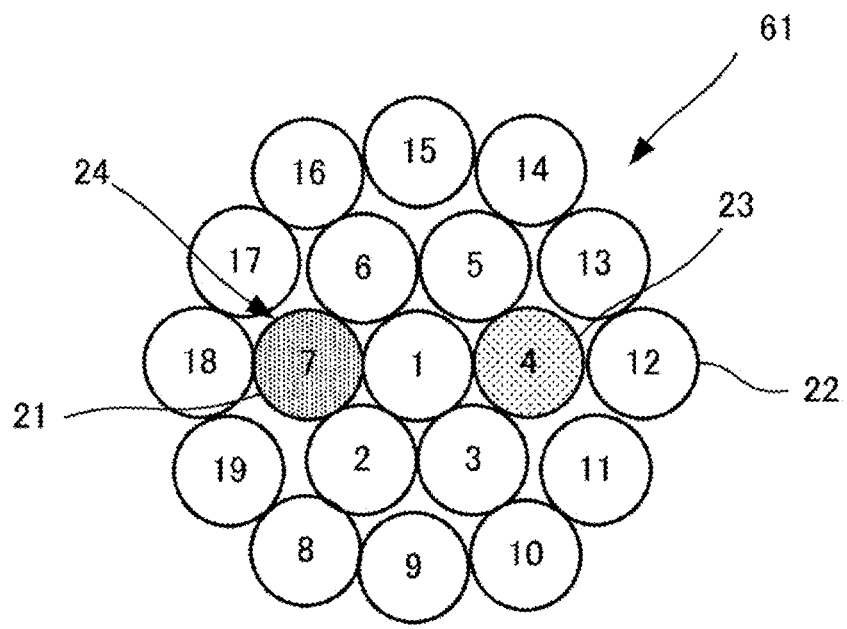
FIG. 6(A) is a cross-sectional view showing the configuration of the antibacterial yarn according to the second embodiment and FIG. 6(B) is a partially enlarged view showing the configuration of the core yarn in the antibacterial yarn according to the third embodiment.
Figure 6B:
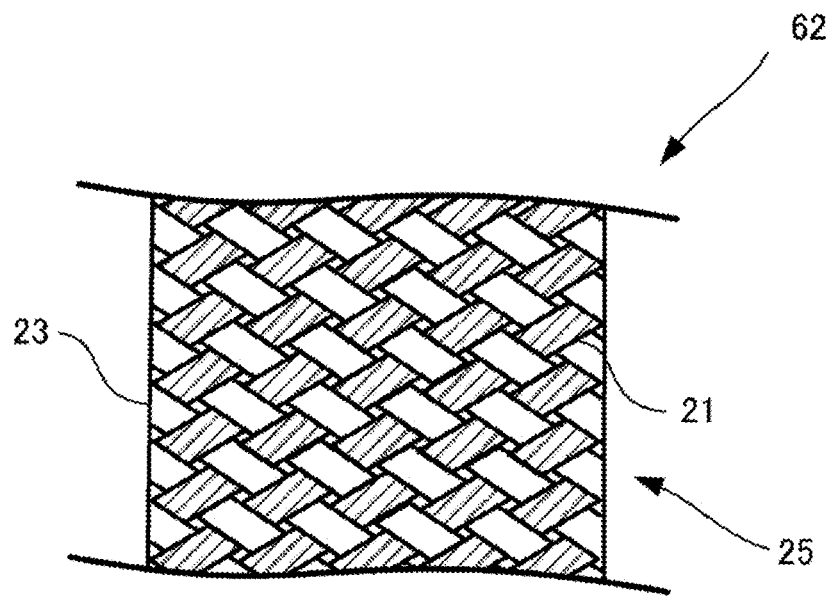

FIG. 6(A) is a cross-sectional view showing the configuration of the antibacterial yarn according to the second embodiment and FIG. 6(B) is a partially enlarged view showing the configuration of the core yarn in the antibacterial yarn according to the third embodiment. In the piezoelectric fibers according to the second embodiment and the third embodiment, the description of the same configuration as that of the piezoelectric fiber according to the first embodiment will be omitted, and only different configurations will be described.

As shown in FIG. 6(A), the antibacterial yarn 61 according to the second embodiment includes a core yarn 24 and first sheath yarns 22. The core yarn 24 is composed of a bundle of yarns 1 to 7 shown in FIG. 6(A). The core yarn 24 includes a core yarn 21 that is a first piezoelectric fiber and a core yarn 23 that is a second piezoelectric fiber. The yarn 7 shown in FIG. 6(A) corresponds to the core yarn 21 (first piezoelectric fiber) and the yarn 4 shown in FIG. 6(A) corresponds to the core yarn 23 (second piezoelectric fiber). The yarns 1 to 3, 5 and 6 are made of non-piezoelectric yarns 20. It should be noted that the core yarn 24 may be composed of only the core yarns 21 and the core yarns 23. For example, the yarns 1 to 7 each may be the core yarn 21 or the core yarn 23.

In the antibacterial yarn 61, the core yarn 24 includes both an S yarn of piezoelectric yarns 110 and a Z yarn of piezoelectric yarns 110. Therefore, the S yarn that generates a negative charge on its surface and the Z yarn that generates a positive charge on its surface can be brought closer to each other. As the S yarn and the Z yarn are closer to each other, a stronger electric field can be generated between the S yarn and the Z yarn. Therefore, it is possible to exert an antibacterial effect efficiently against the bacteria attracted by the antibacterial yarn 61.

As shown in FIG. 6(B), the antibacterial yarn 62 according to the third embodiment includes a core yarn 25. The core yarn 25 includes core yarns 21 which are first piezoelectric fibers and core yarns 23 which are second piezoelectric fibers. The core yarn 25 is a braided cord in which the core yarns 21 and the core yarns 23 are combined. The core yarn 25 is just required to have a cord-like structure composed of core yarns 21 and core yarns 23 and is not limited to only the braided cord. For example, it may be a twisted yarn in which core yarns 21 and core yarns 23 are twisted.

In the antibacterial yarn 62, the core yarn 25 includes both an S yarn of piezoelectric yarns 110 and a Z yarn of piezoelectric yarns 110. Therefore, the S yarn that generates a negative charge on its surface and the Z yarn that generates a positive charge on its surface can be brought closer to each other. As the S yarn and the Z yarn are closer to each other, a stronger electric field can be generated between the S yarn and the Z yarn. Therefore, it is possible to exert an antibacterial effect efficiently against the bacteria attracted by the antibacterial yarn 62.

Figure 7A:
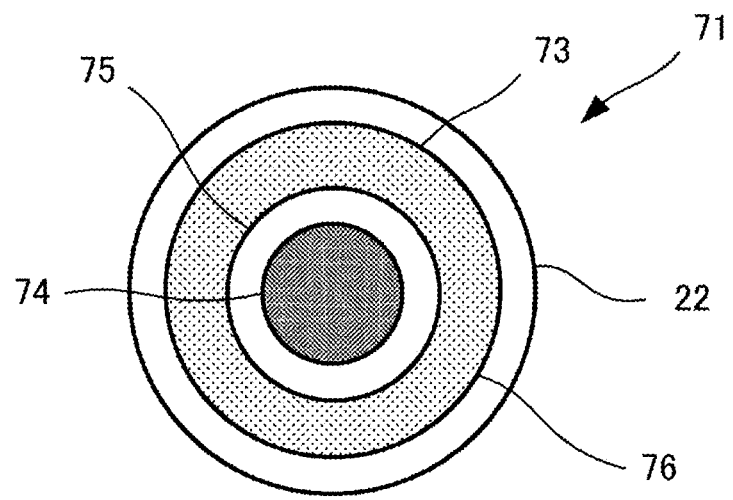
FIG. 7(A) and FIG. 7(B) are cross-sectional views each showing the configuration of the antibacterial yarn according to the fourth embodiment.
Figure 7B:
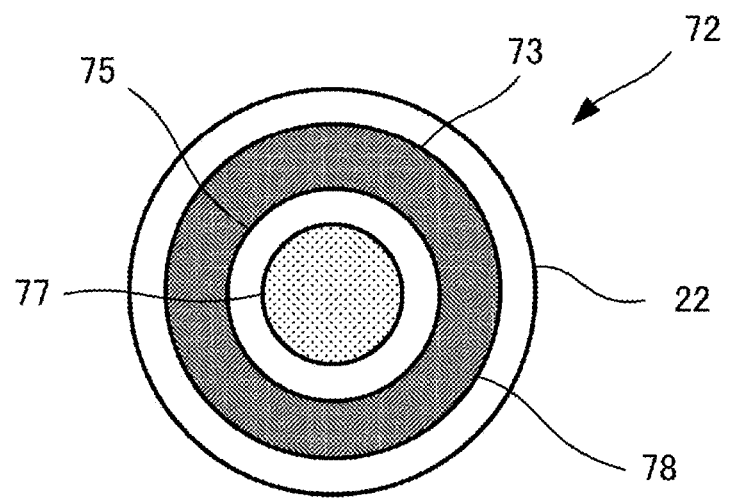

FIG. 7(A) and FIG. 7(B) are cross-sectional views each showing the configuration of the antibacterial yarn according to the fourth embodiment. In the antibacterial yarn according to the fourth embodiment, the description of the same configuration as that of the antibacterial yarn according to the first embodiment will be omitted, and only different configurations will be described.

As shown in FIG. 7(A), the antibacterial yarn 71 according to the fourth embodiment includes a core yarn 73 and a first sheath yarn 22. The first sheath yarn 22 covers the periphery of the core yarn 73. The core yarn 73 includes a central layer 74, a second sheath yarn layer 75, and an outer layer 76. The second sheath yarn layer 75 is disposed in such a manner that the second sheath yarn layer covers the periphery of the central layer 74 and the outer layer 76 is disposed in such a manner that the outer layer covers the periphery of the second sheath yarn layer 75. As a result, the second sheath yarn layer 75 is located between the central layer 74 and the outer layer 76. The second sheath yarn layer 75 is a layer including the second sheath yarn of the present invention.

The central layer 74 includes a first piezoelectric fiber made of an S yarn of piezoelectric yarns 110. The outer layer 76 includes a second piezoelectric fiber composed of a Z yarn of piezoelectric yarns 110. The second sheath yarn layer 75 is a yarn similar to the first sheath yarn 22, and it is made of a material higher in hygroscopicity than the first piezoelectric fiber and the second piezoelectric fiber.

Therefore, the antibacterial yarn 71 includes a central layer 74 that generates a negative charge on its surface and an outer layer 76 that generates a positive charge on its surface. There exists a second sheath yarn layer 75 having a high hygroscopicity between the central layer 74 and the outer layer 76. Therefore, an antibacterial effect can be exerted against bacteria and the like having adhered to moisture absorbed by the second sheath yarn layer 75 efficiently by a strong electric field generated between the central layer 74 surrounding the periphery of the second sheath yarn layer 75 and the outer layer 76.

As shown in FIG. 7(B), the antibacterial yarn 72 according to the fourth embodiment is different from the antibacterial yarn 71 only in that the material of the central layer 74 and the material of the outer layer 76 are reversed. For this reason, only this difference will be explained, and description on common items will be omitted.

In the antibacterial yarn 72, the central layer 77 includes a second piezoelectric fiber composed of a Z yarn of piezoelectric yarns 110. The outer layer 78 includes a first piezoelectric fiber composed of an S yarn of piezoelectric yarns 110. The antibacterial yarn 72 includes a central layer 77 that generates a positive charge on its surface and an outer layer 78 that generates a negative charge on its surface. There exists a second sheath yarn layer 75 having a high hygroscopicity between the central layer 77 and the outer layer 78. Therefore, an antibacterial effect can be exerted against bacteria and the like having adhered to moisture absorbed by the second sheath yarn layer 75 efficiently by a strong electric field generated between the surrounding central layer 77 and the outer layer 78.

Figure 8A:
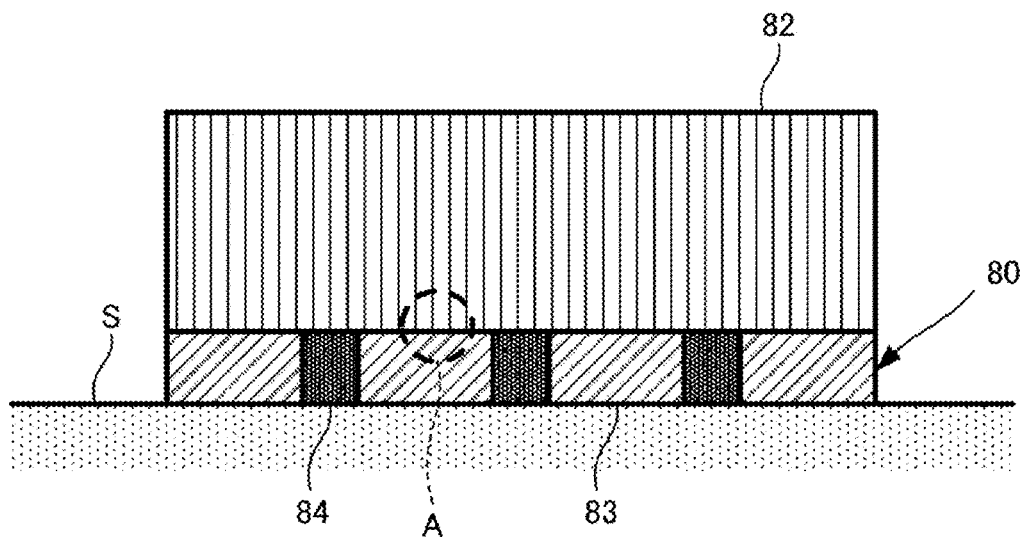
FIG. 8(A) is a schematic view for explaining a plaster bandage using the antibacterial fabric according to the first embodiment and FIG. 8(B) is a partially enlarged view of FIG. 8(A).

Next, an example of the use of the antibacterial fabric 100 will be described. FIG. 8(A) is a schematic view for explaining a plaster bandage using the antibacterial fabric 100 according to the first embodiment and FIG. 8(B) is an enlarged view of a part surrounded by the broken line A of FIG. 8(A).

As shown in FIG. 8(A), the plaster bandage 80 is disposed between a human skin S and a plaster 82 and is used for protecting the skin S. The plaster bandage 80 includes a first portion 83 having a lower coefficient of friction when being in contact with the plaster 82 and a second portion 84 having a higher coefficient of friction.

When a force is applied to the plaster 82, the plaster 82 moves while being in contact with the plaster bandage 80. At this time, in the plaster bandage 80, the second portion 84 having a higher coefficient of friction exhibits a small motion. In contrast, the first portion 83 having a lower coefficient of friction exhibits a large motion and expands and shrinks at an increased degree by being pulled by the second portion 84.

Figure 8B:
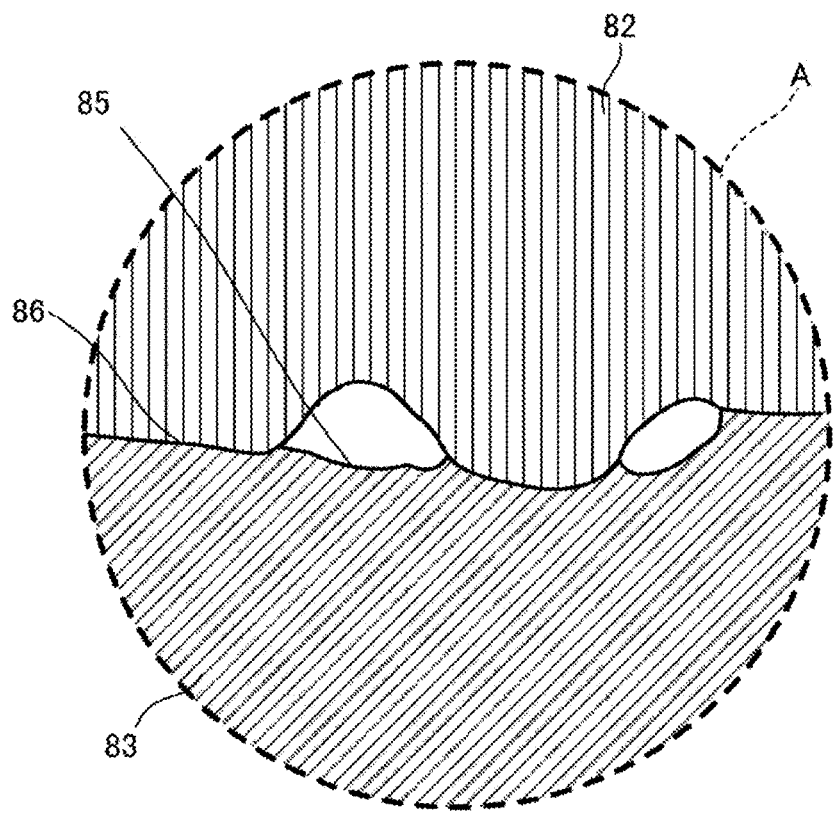

As shown in FIG. 8(B), the plaster bandage 80 includes a non-bonded portion 85 that is not bonded to the plaster 82 and a bonded portion 86 bonded to the plaster 82. The non-bonded portion 85 and the bonded portion 86 can be formed concurrently when the plaster 82 is formed on the plaster bandage 80. That is, by drying the plaster 82 with a part of the plaster bandage 80 sticking to or being caught in the plaster 82, a part of the plaster bandage 80 is bonded to the plaster 82 and the bonded portion 86 is formed.

Since the non-bonded portion 85 and the bonded portion 86 are present in combination, the bonded portion 86 remains fixed when the plaster 82 moves. In contrast, the non-bonded portion 85 moves with inclusion of the motion suppressed by the bonded portion 86. Therefore, the non-bonded portion 85 is greatly expanded and shrunk. It is noted that the bonded portion 86 is not necessarily required to be formed. When the bonded portion 86 is not formed, the expansion and shrinkage of the non-bonded portion 85 is smaller than in the case where the bonded portion 86 is formed, but damping can be prevented because air permeability between the plaster bandage 80 and the plaster 82 is secured. In addition, since the antibacterial fabric 100 used for the plaster bandage 80 includes non-piezoelectric yarns 20 selected from among cotton, wool, etc., hygroscopicity and texture can be improved.

Figure 9A:
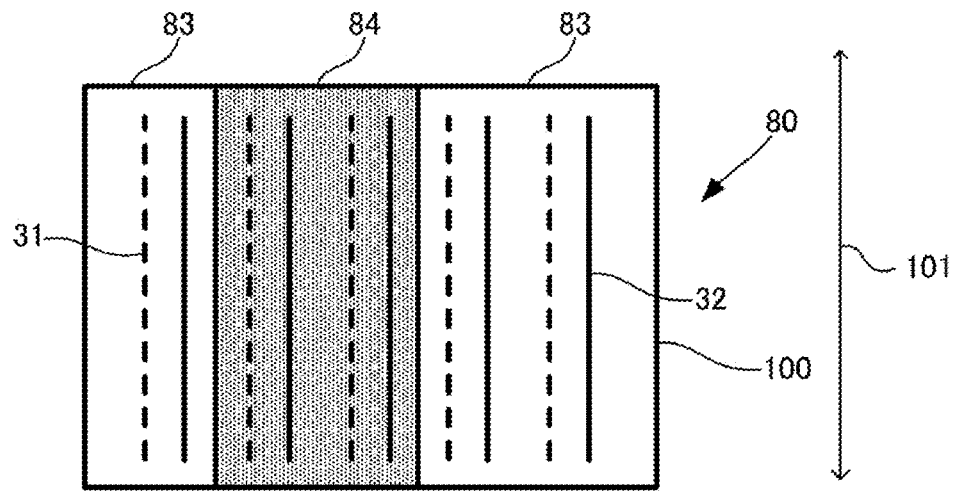
FIG. 9(A) is a schematic view showing an antibacterial fabric relating to a plaster bandage and FIG. 9(B) is a partially enlarged view of FIG. 9(A).
Figure 9B:
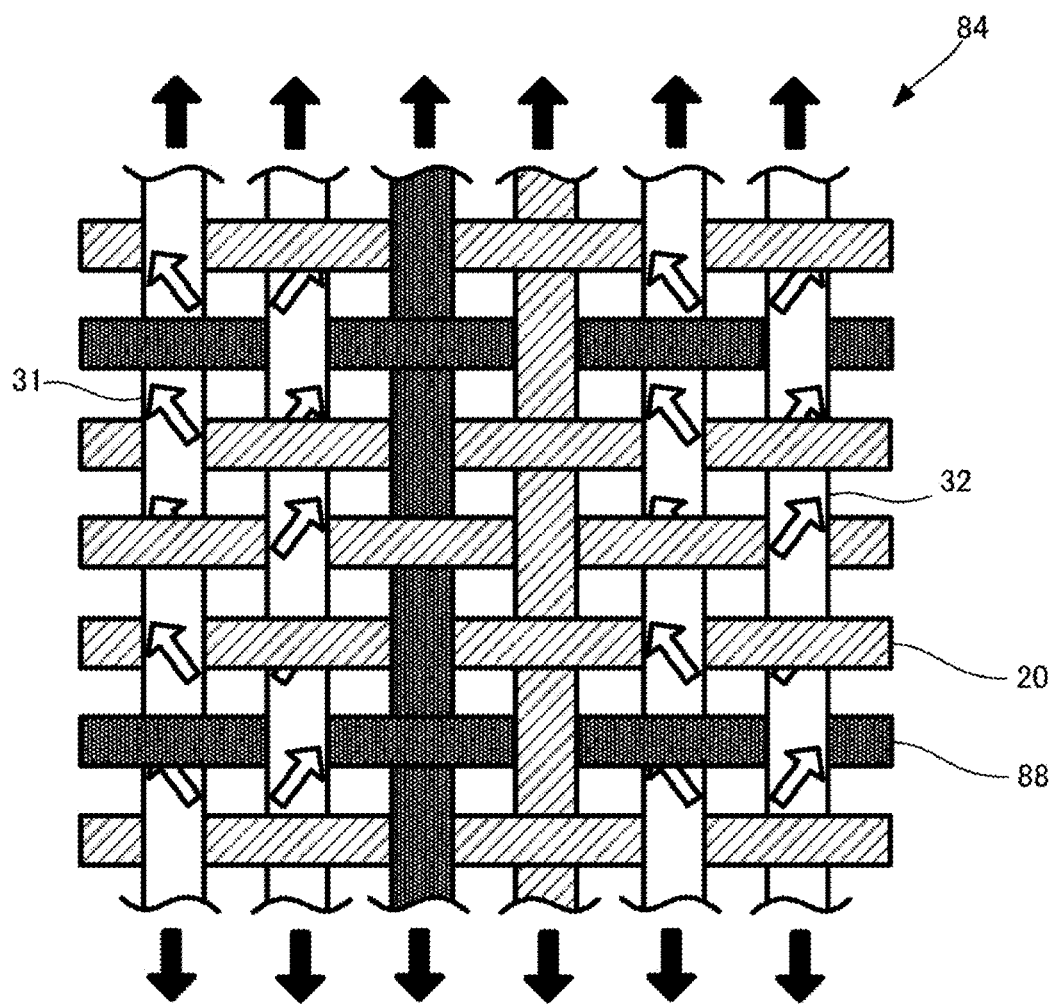

FIG. 9(A) is a schematic view showing an antibacterial fabric relating to a plaster bandage and FIG. 9(B) is a partially enlarged view of the second portion 84 having a higher coefficient of friction in FIG. 9(A). As shown in FIG. 9(A), the plaster bandage 80 includes an antibacterial fabric 100. In the antibacterial fabric 100, the first antibacterial yarns 31 and the second antibacterial yarns 32 are woven together with the non-piezoelectric yarns 20 with the first antibacterial yarns and the second antibacterial yarns arranged alternately in parallel.

As shown in FIG. 9(B), in order to construct the second portion 84 as the plaster bandage 80, a yarn 88 with a lower stretchability is interwoven in a part of the antibacterial fabric 100. As the yarn 88 with a lower stretchability, for example, metal fibers, chemical fibers, or the like can be used. Moreover, depending on the fiber to be used as such a yarn 88, the texture, etc. of the plaster bandage 80 can be changed according to the use conditions.

Furthermore, it is preferable that the plaster bandage 80 is easy to expand and shrink with respect to the axial direction 101 of the first antibacterial yarn 31 and the second antibacterial yarn 32. For example, as the wefts shown in FIG. 9(B), there are used non-piezoelectric yarns 20 lower in stretchability than the first antibacterial yarn 31 and the second antibacterial yarn 32, which are the warps. Alternatively, it can also be realized by weaving the wefts as a pair of two non-piezoelectric yarns 20. As a result, charges can be efficiently generated from the first antibacterial yarn 31 and the second antibacterial yarn 32, so that the antibacterial effect can be further improved.

Generally, bandages are used to protect, compress or fix affected parts such as wounds. When a state of being wound over a long period of time like bandages used for plasters is maintained, secretion fluids or exudates such as sweat or body fat emitted from the skin, as well as dirt, etc. adhere to the bandage. As a result, bacteria may develop and proliferate in the bandage, which may adversely affect the human body. As one means for solving this problem, for example, a method of applying an antibacterial agent onto the surface of a bandage or into the bandage has been proposed as disclosed in Japanese Patent Application Laid-open No. 2014-83070. In this case, however, the applied chemical agent disappears with time, so that it may be difficult to maintain the effect over a long period of time. Moreover, when a chemical agent is used, there is a risk that an allergic reaction may be caused due to long-term contact of the chemical agent on the skin.

In contrast, when the plaster bandage 80 is used while being wound between the human skin S and the plaster 82 as shown in FIG. 8(A), an antibacterial effect is exerted by the antibacterial fabric 100 included in the plaster bandage 80. In addition, when the plaster bandage 80 expands or shrinks, it exerts an antibacterial effect by generating charges, so that it can maintain the effect for a long period of time and can prevent allergic reactions caused by chemical agents.

When a bandage that entirely expands and shrinks uniformly, in other words, that is entirely uniform in coefficient of friction, is use as a plaster bandage, a force is added uniformly to the entire bandage. In this case, distortion due to friction is small as a whole. In view of this, the plaster bandage 80 includes a first portion 83 having a lower coefficient of friction and a second portion 84 having a higher coefficient of friction. In the plaster bandage 80, the first portion 83 having a lower coefficient of friction is large in the degree of expansion and shrinkage. In the case where the plaster bandage 80 expands and shrinks due to the contact of the plaster bandage 80 with the plaster 82, even a small motion can generate larger charges in the first portion 83 because the expansion and shrinkage of the first portion 83 are relatively large. Therefore, the plaster bandage 80 can exert an enhanced antibacterial effect.

The plaster bandage 80 is not limited to this and may be a nonwoven fabric or the like.

In addition, the antibacterial fabric 100 to be used as the plaster bandage 80 can use not only a woven fabric but also a knitted fabric like that described below.

Figure 10A:
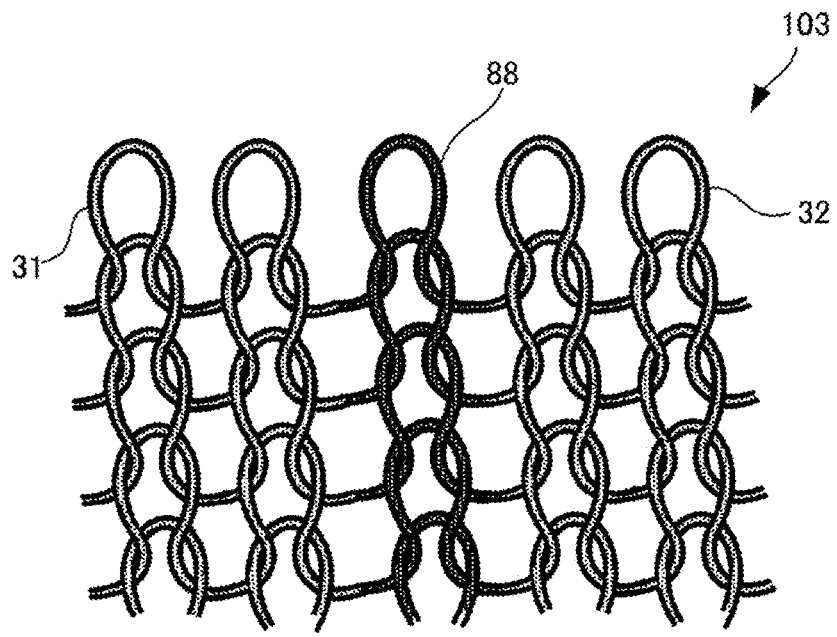
FIG. 10(A) and FIG. 10(B) are schematic views each showing a variation of the antibacterial fabric relating to a plaster bandage.
Figure 10B:
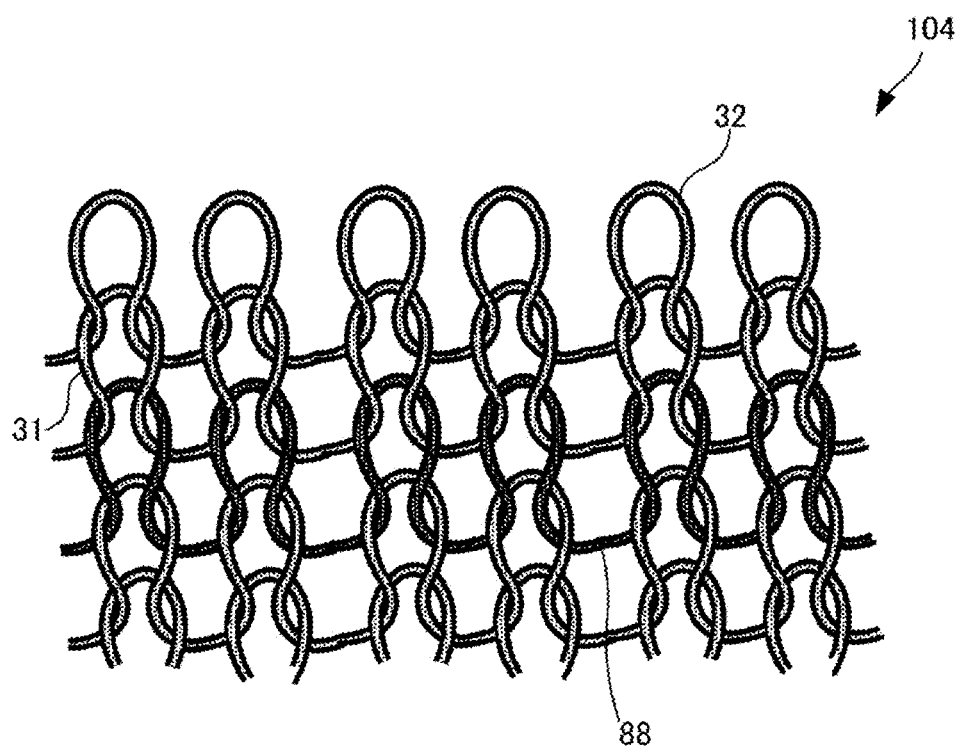

FIG. 10(A) is a schematic view showing variation 1 of the antibacterial fabric 100 relating to the plaster bandage 80. FIG. 10(B) is a schematic view showing variation 2 of the antibacterial fabric 100 relating to the plaster bandage 80. In the description of the variations, descriptions of the same items as those of the antibacterial fabric 100 relating to the plaster bandage 80 will be omitted.

As shown in FIG. 10(A), the plaster bandage 80 is made of an antibacterial fabric 103 that is a knitted fabric. The antibacterial fabric 103 uses first antibacterial yarns 31, second antibacterial yarns 32, and yarns 88 having a lower stretchability as knitting yarns. Yarns other than the first antibacterial yarns 31, the second antibacterial yarns 32, and the yarns 88 can also be used as knitting yarns.

In the antibacterial fabric 103, since the yarns 88 are knitted in the longitudinal direction of the page of FIG. 10(A), a portion that unreadily expands and shrinks along the longitudinal direction of the page of FIG. 10(A) is formed. As a result, in the antibacterial fabric 103, a second portion 84 having a higher coefficient of friction can be formed in the periphery around which the yarns 88 are knitted.

As shown in FIG. 10(B), the plaster bandage 80 is made of an antibacterial fabric 104 that is a knitted fabric. In the description of the antibacterial fabric 104, descriptions of the same items as those of the antibacterial fabric 103 will be omitted.

In the antibacterial fabric 104, since the yarns 88 are knitted in the transverse direction of the page of FIG. 10(B), a portion that unreadily expands and shrinks along the transverse direction of the page of FIG. 10(B) is formed. As a result, in the antibacterial fabric 104, a second portion 84 having a higher coefficient of friction can be formed in the periphery around which the yarns 88 are knitted.

In the antibacterial fabric 103 and the antibacterial fabric 104, it is also possible to partially form a portion that unreadily expands and shrinks by applying and fixing a wax or a bonding agent instead of weaving the yarns 88. Alternatively, it is also possible to partially form a portion that unreadily expands and shrinks by partially doubling yarns to be used or by forming a portion with a fine mesh. Furthermore, the shape of the mesh is not limited to this and can be changed appropriately depending on use.

The yarns to be used for the antibacterial fabrics in the embodiments may be either the same or different in thickness. Accordingly, properties such as stretchability and thickness of the antibacterial fabric can be adjusted depending on its applications.

Finally, the description of the present embodiments is to be considered in all respects as illustrative and not restrictive. The scope of the present invention is indicated not by the above-described embodiments but by the claims. Furthermore, it is intended that the scope of the invention includes all variations within meanings and scopes equivalent to the claims.

DESCRIPTION OF REFERENCE SYMBOLS

21: Core yarn (first piezoelectric fiber)
23: Core yarn (second piezoelectric fiber)
24, 25, 73: Core yarn
22: First sheath yarn
31: First antibacterial yarn
32: Second antibacterial yarn
61, 62, 71, 72: Antibacterial yarn
75: Second sheath yarn
100, 103, 104: Antibacterial fabric
101: Axial direction

The invention claimed is:

1. An antibacterial yarn comprising:
a core yarn including a functional polymer that generates a charge by external energy; and
a first sheath yarn higher in hygroscopicity than the core yarn, the first sheath yarn covering at least a part of a periphery of the core yarn across an axial direction of the core yarn, wherein
the core yarn comprises a first piezoelectric fiber that generates a negative charge by external energy, and a second piezoelectric fiber that generates a positive charge by external energy,
the core yarn further comprises a second sheath yarn higher in hygroscopicity than the first piezoelectric fiber and the second piezoelectric fiber, and
the second sheath yarn is disposed between the first piezoelectric fiber and the second piezoelectric fiber.

2. The antibacterial yarn according to claim 1, wherein
the second sheath yarn covers a periphery of the first piezoelectric fiber across an axial direction of the first piezoelectric fiber, and
the second piezoelectric fiber covers a periphery of the second sheath yarn across an axial direction of the second sheath yarn.

3. The antibacterial yarn according to claim 1, wherein
the second sheath yarn covers a periphery of the second piezoelectric fiber across an axial direction of the second piezoelectric fiber, and
the first piezoelectric fiber covers a periphery of the second sheath yarn across an axial direction of the second sheath yarn.

4. The antibacterial yarn according to claim 1 wherein the first sheath yarn covers an entirety of the periphery of the core yarn.

5. An antibacterial yarn comprising:
a core yarn including a functional polymer that generates a charge by external energy; and
a first sheath yarn higher in hygroscopicity than the core yarn, the first sheath yarn covering at least a part of a periphery of the core yarn across an axial direction of the core yarn, wherein
the core yarn comprises a plurality of multifilament yarns
the core yarn is a twisted yarn, and
an axial direction of the core yarn is inclined relative to an axial direction of the antibacterial yarn.

6. An antibacterial yarn comprising:
a core yarn including a functional polymer that generates a charge by external energy; and
a first sheath yarn higher in hygroscopicity than the core yarn, the first sheath yarn covering at least a part of a periphery of the core yarn across an axial direction of the core yarn, wherein
the core yarn comprises a first piezoelectric fiber that generates a negative charge by external energy, and a second piezoelectric fiber that generates a positive charge by external energy, and
the core yarn further includes a metal fiber.

7. The antibacterial yarn according to claim 1, wherein the core yarn further includes a polyvinylidene fluoride fiber.

8. An antibacterial fabric comprising:
a first antibacterial yarn comprising:
a first core yarn including a functional polymer that generates a charge by external energy; and
a first sheath yarn higher in hygroscopicity than the first core yarn, the first sheath yarn covering at least a part of a periphery of the first core yarn across an axial direction of the first core yarn, wherein
the first core yarn comprises a first piezoelectric fiber that generates a negative charge by external energy, and a second piezoelectric fiber that generates a positive charge by external energy;
a second antibacterial yarn woven together with the first antibacterial yarn, the second antibacterial yarn comprising:
a second core yarn including a functional polymer that generates a charge by external energy opposite to that of the first core yarn; and
a second sheath yarn higher in hygroscopicity than the second core yarn, the second sheath yarn covering at least a part of a periphery of the second core yarn across an axial direction of the second core yarn; and
a non-piezoelectric yarn woven together with the first antibacterial yarn and the second antibacterial yarn, wherein
the non-piezoelectric yarn is a weft yarn, and the first antibacterial yarn and the second antibacterial yarn are warp yarns.

9. The antibacterial fabric according to claim 8, wherein at least one of the first core and the second core comprises a plurality of multifilament yarns.

10. The antibacterial fabric according to claim 9, wherein the at least one of the first core and the second core that comprises the plurality of multifilament yarns is a twisted yarn.

* * * * *